United States Patent

Xu et al.

[11] Patent Number: 5,821,834
[45] Date of Patent: Oct. 13, 1998

[54] SURFACE WAVE DEVICE WITH CAPACITANCE

[75] Inventors: Yufeng Xu; Ji-Dong Dai; Zhuo-Hui Chen, all of Kanata, Canada

[73] Assignee: Northern Telecom Limited, Montreal, Canada

[21] Appl. No.: 854,067

[22] Filed: May 8, 1997

[30] Foreign Application Priority Data

Mar. 5, 1997 [CA] Canada ................... 2199238

[51] Int. Cl.⁶ .................. H03H 9/64; H03H 9/25
[52] U.S. Cl. ............... 333/193; 333/194; 310/313 B
[58] Field of Search .................. 333/193–196; 310/313 R, 313 B, 313 C, 313 D

[56] References Cited

U.S. PATENT DOCUMENTS

| Re. 33,957 | 6/1992 | Nakazawa et al. | 333/195 |
|---|---|---|---|
| 5,365,138 | 11/1994 | Saw et al. | 310/313 |
| 5,581,141 | 12/1996 | Yamada et al. | 310/313 |

FOREIGN PATENT DOCUMENTS

| 63-102411 | 5/1988 | Japan | 333/193 |
|---|---|---|---|
| 4-113711 A | 4/1992 | Japan | 333/193 |
| 2-148934 | 5/1992 | Japan . | |
| 5-55855 A | 3/1993 | Japan | 333/193 |
| 6-152314 A | 5/1994 | Japan | 333/193 |
| WO 97/00556 | 1/1997 | WIPO | H03H 9/64 |

OTHER PUBLICATIONS

"Narrow Bandpass Filter Using Double–Mode SAW Resonators on Quartz", M. Tanaka et al., IEEE 38th Annual Frequency Control Symposium, 1984, pp. 286–293.

Primary Examiner—Steven Mottola
Assistant Examiner—Barbara Summons
Attorney, Agent, or Firm—R. John Haley

[57] ABSTRACT

A surface wave device filter comprises two 2-pole waveguide coupled double mode resonators (WCRs) electrically connected together in cascade. To permit narrowing of the filter passband for improved out-of-band rejection, e.g. for use of the filter as an intermediate frequency channel filter in a wireless communications system, while maintaining good matching for low ripple in the passband, a shunt capacitance is connected in parallel with the static capacitances of the two WCRs. The shunt capacitance is constituted by interdigital fingers provided on the same piezoelectric substrate as one or both of the WCRs, perpendicularly to the WCR fingers to avoid surface wave interference, conveniently in space otherwise used by rails of the WCRs, optionally with oppositely phased fingers to cancel surface waves generated by these fingers. A capacitance can be similarly provided on the same substrate as any other type of surface wave device.

25 Claims, 3 Drawing Sheets

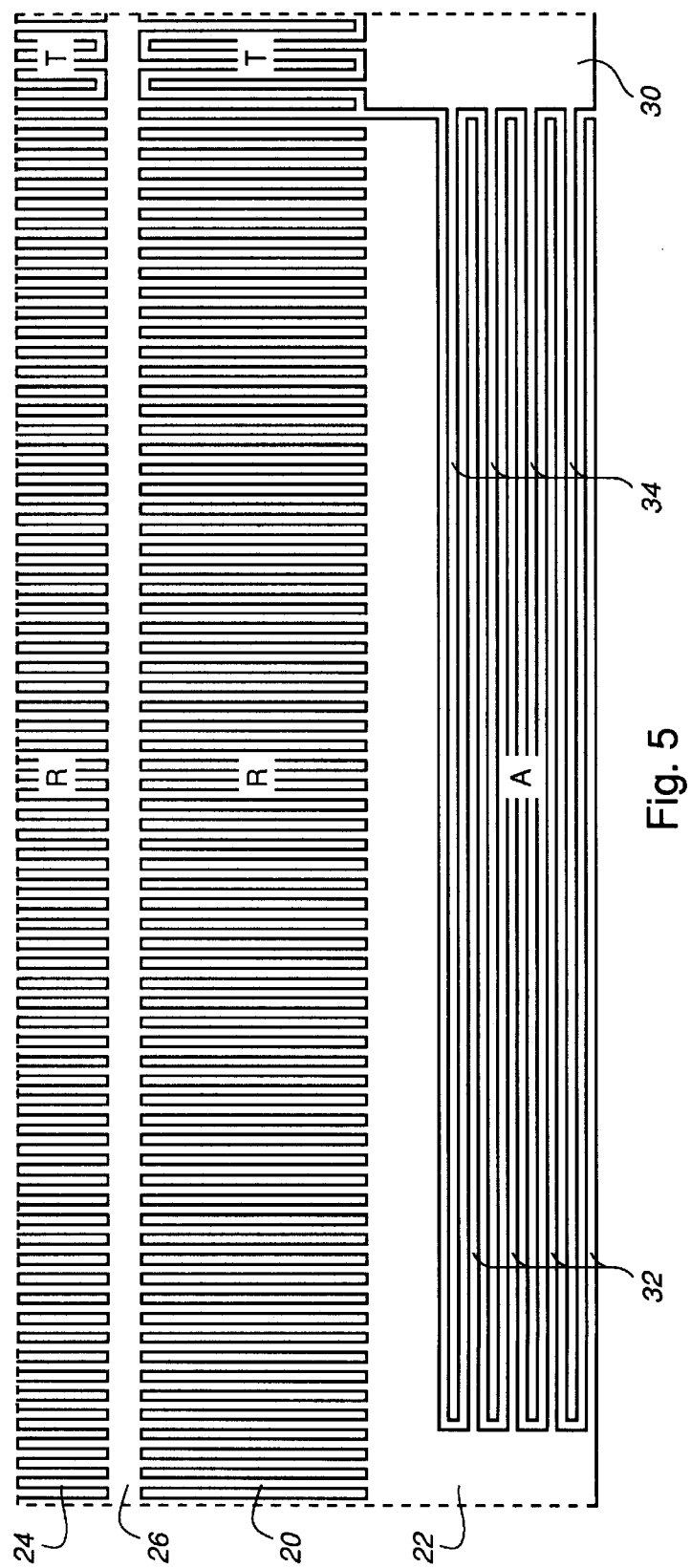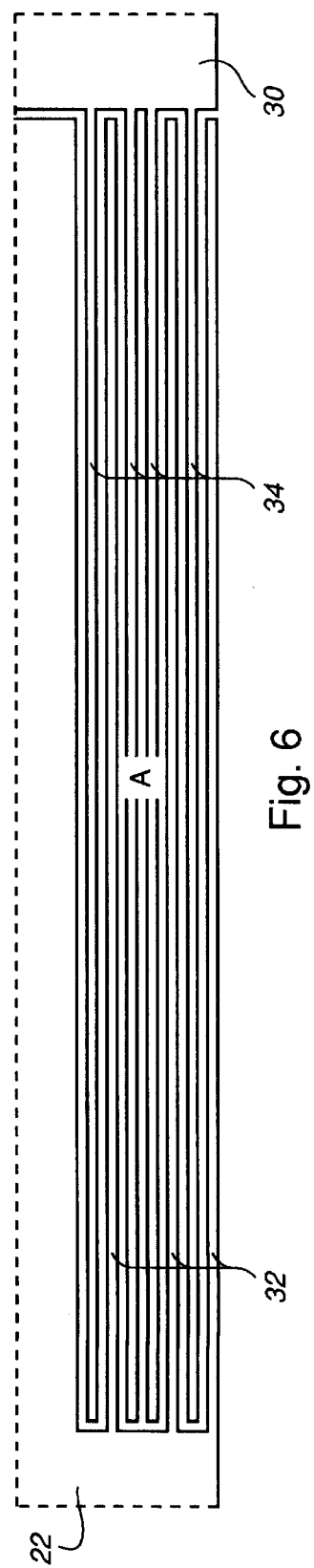

SURFACE WAVE DEVICE WITH CAPACITANCE

This invention relates to surface wave devices, the term "surface wave" being used herein to embrace surface acoustic waves (SAWs), including leaky SAWs, and surface skimming bulk waves.

BACKGROUND OF THE INVENTION

It is well known to provide various forms of surface wave device for various applications. In particular, it is known to use surface wave devices for RF (radio frequency) and IF (intermediate frequency) filtering in wireless communications apparatus such as cellular communications base stations and terminals. Such surface wave device filters include double mode surface wave resonators such as waveguide coupled resonators (WCRs) and longitudinally coupled resonators (LCRs).

WCRs, also referred to as transversely coupled resonators, are particularly useful for IF filtering and can provide balanced and/or unbalanced input and/or output connections as described in Saw et al. U.S. Patent No. 5,365,138, issued Nov. 15, 1994 and entitled "Double Mode Surface Wave Resonators". A plurality of such 2-pole filters can be coupled in cascade to provide a higher-order filter having an improved filter response, for example as described in International Patent Application PCT/CA96/00373 published Jan. 3, 1997, Publication No. WO 97/00556, entitled "Cascaded Surface Wave Device Filters". That published application also describes LCRs which are particularly useful for RF filtering.

WCRs and their connection in cascade to form a 4-pole filter are also described in an article by M. Tanaka et al. entitled "Narrow Bandpass Filter Using Double-Mode SAW Resonators On Quartz", IEEE 38th Annual Frequency Control Symposium, 1984, pages 286 to 293, and in Nakazawa et al. U.S. Reissued Pat. No. Re. 33,957 reissued Jun. 6, 1992, entitled "High Frequency Narrow-Band Multi-Mode Filter".

For channel filtering at IF in a base station of a wireless communications system, it is recognized that cascading of two or three 2-pole WCRs may be necessary to provide the required filter response, in particular a desired sharp roll-off and high out-of-band rejection. For example, for a TDMA (time division multiple access) system as is used in North America a rejection of at least 30 dB is required at frequencies 60 kHz from the center frequency of the filter.

A 4-pole resonator filter using two 2-pole WCRs connected in cascade has an optimal fractional bandwidth of about 0.07%, i.e. a bandwidth of about 60 kHz for a center frequency (IF) of 85 MHz. To meet the required rejection discussed above, the bandwidth of the filter must be reduced. Achieving this only by changing the difference between the symmetric and antisymmetric mode frequencies for which the WCRs are designed results in an increase in the passband ripple of the filter due to poor matching, which results in filter requirements for passband ripple not being met.

An object of this invention, therefore, is to provide an improved filter comprising WCRs connected in cascade.

SUMMARY OF THE INVENTION

According to one aspect of this invention there is provided a surface wave device comprising two waveguide coupled double mode resonators (WCRs) electrically connected together in cascade, and a shunt capacitance connected in parallel with static capacitances of the WCRs.

The capacitance ratio, i.e. the ratio of dynamic capacitance to static capacitance, of the cascaded WCRs is effectively decreased by the shunt capacitance to facilitate good matching even though the difference between the symmetric and antisymmetric mode frequencies of the WCRs is decreased. Consequently the cascaded WCRs can have a reduced bandwidth to achieve a desired out-of-band rejection and can still have a relatively ripple-free passband.

The two WCRs can be electrically connected in cascade via an unbalanced signal connection, the shunt capacitance being connected between the unbalanced signal connection and a ground connection. Alternatively, the two WCRs can be electrically connected in cascade via two balanced signal connections. In this case the shunt capacitance can be connected between the two balanced signal connections, and/or there can be two shunt capacitances each connected between a respective one of the two balanced signal connections and a ground connection.

Preferably each shunt capacitance is constituted by fingers forming an interdigital structure (IDS) on a surface of a piezoelectric substrate on which at least one of the WCRs is provided. Each IDS is preferably arranged so that any surface waves propagated by the IDS have a substantially different direction of propagation from that of surface waves of each WCR on the same substrate. Conveniently, interdigital fingers of each IDS are substantially perpendicular to fingers of each WCR on the same substrate, and in this case they can be positioned in a reduced-width portion of signal and/or ground conductive rails of at least one of the WCRs.

The interdigital fingers of each IDS can include oppositely phased fingers, surface waves propagated by the oppositely phased fingers substantially cancelling one another.

The WCRs and each IDS can all be provided on a surface of the same piezoelectric substrate; alternatively the WCRs can be provided on surfaces of two respective piezoelectric substrates mounted in the same package, each IDS being provided on a surface of one of the two piezoelectric substrates.

Although embodiments of the invention described below relate specifically to WCRs connected together in cascade, the principles of the invention can be applied to cascaded arrangements of other forms of surface wave resonators or filters, or to any other form of surface wave device in which it may be desirable or advantageous to provide a capacitance.

Thus according to another aspect, this invention provides a surface wave device comprising: a piezoelectric substrate; at least one interdigital transducer (IDT) on a surface of the substrate for propagating and/or responding to surface waves in a first direction on the substrate; and a capacitance comprising fingers forming at least one interdigital structure (IDS) on the surface of the substrate arranged so that any surface waves propagated on the surface of the substrate by the IDS have a second direction of propagation that is substantially different from the first direction.

The fingers of the IDS are preferably substantially perpendicular to fingers of the IDT, whereby the second direction is substantially perpendicular to the first direction. The IDS can include oppositely phased interdigital fingers for cancelling undesired surface waves.

The IDS can be connected between connection rails of a surface wave component comprising the IDT, and can be positioned in a reduced-width portion of at least one of the connection rails. The surface wave component comprising the IDT can comprise a double mode surface wave resonator, and preferably comprises two waveguide coupled resonators (WCRs) electrically connected together in cascade via at least one signal connection which includes a connection rail to which the IDS is connected. The two WCRs can be connected together in cascade via two balanced signal connections including respective connection rails, in which case there can be two IDSs each arranged to provide a capacitance to ground from a respective one of the two balanced signal connections, and/or the IDS can provide the capacitance between the two balanced signal connections.

A further aspect of the invention provides a surface wave device comprising at least two waveguide coupled double mode surface wave resonators (WCRs) electrically connected together in cascade, the WCRs being provided in a single package on a surface of at least one piezoelectric substrate, and at least one shunt capacitance connected in parallel with a static capacitance of at least one of the WCRs, the shunt capacitance being constituted by fingers forming an interdigital structure (IDS) on said surface and arranged to avoid interference with surface waves propagated by the WCRs.

The fingers forming the IDS can be substantially perpendicular to fingers of each WCR on the same substrate, and/or can be arranged to substantially suppress generation of surface waves by the IDS, to avoid interference with surface waves propagated by the WCRs.

BRIEF DESCRIPTION OF THE DRAWINGS

The invention will be further understood from the following description with reference to the accompanying drawings, in which:

FIGS. 5 and 6 schematically illustrate in enlarged views alternative arrangements of the additional capacitance of FIGS. 1 and 4;

DETAILED DESCRIPTION

As indicated in the background of the invention, meeting a required out-of-band rejection in a 4-pole (or higher order) filter comprising WCRs connected in cascade implies that the bandwidth of the filter must be reduced, but it is also necessary to avoid unduly increasing ripple in the passband of the filter. In embodiments of the invention described below this is achieved by decreasing in known manner the difference between the symmetric and antisymmetric mode frequencies for which the WCRs are designed, thereby decreasing the bandwidth of the filter as is desired to achieve an increased rejection for a given out-of-band offset from the center frequency of the filter, and also simultaneously decreasing the ratio of dynamic to static capacitance of the WCRs, thereby maintaining good matching between the cascaded WCRs to achieve low passband ripple.

More particularly, this ratio is decreased by increasing the effective static capacitance of one or both of the cascaded WCRs by providing an additional capacitance for example as described below. The static capacitance is represented by a shunt capacitance $C_0$ in the equivalent circuits in FIGS. 4(a) and (b) of the Tanaka et al. article and in FIG. 4 of the Nakazawa et al. patent, and by shunt capacitances Ct in the equivalent circuit in FIG. 5 of the Saw et al. patent, referred to above. Accordingly, in the cascaded WCRs described below the additional capacitance is connected as one or more shunt capacitances from connection(s) between the cascaded WCRs to ground, and/or between balanced connections between the WCRs, so as to be in parallel with these static capacitances of the WCRs.

Figure 1:
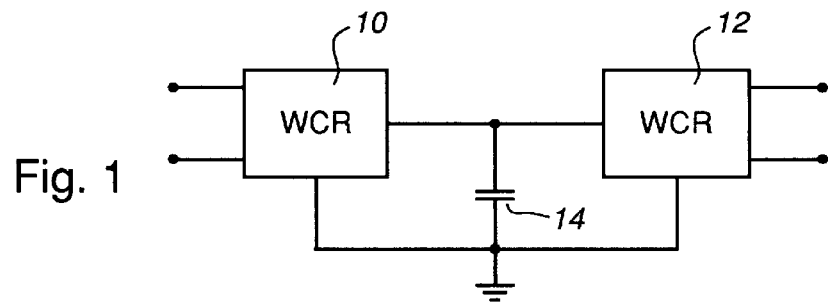
FIGS. 1, 2 and 3 schematically illustrate alternative circuit arrangements of cascaded WCRs with additional capacitance(s)

Referring to FIG. 1, a surface wave device comprises two 2-pole WCRs 10 and 12 which are coupled together in cascade to form a 4-pole filter. As shown in FIG. 1, each of the WCRs 10 and 12 has one differential or balanced termination which forms an input or output of the filter, and one single-ended or unbalanced termination, the unbalanced terminations being interconnected to couple the WCRs in cascade. The WCRs 10 and 12 also can have ground connections as illustrated in FIG. 1, and an additional shunt capacitance 14 is connected between the interconnection of the WCRs and ground.

Figure 2:
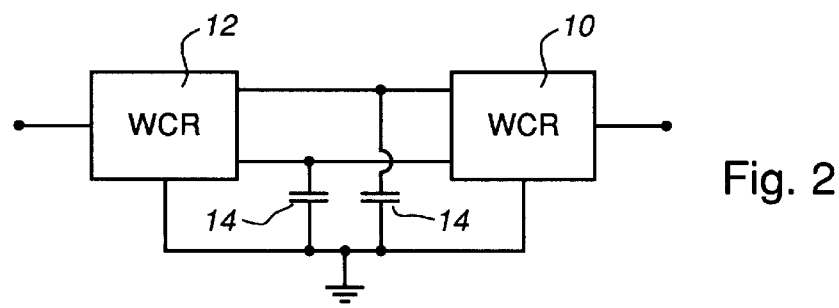

In an alternative arrangement as shown in FIG. 2, the WCRs 10 and 12 have their balanced terminations interconnected, and connected to respective shunt capacitances 14 to ground, and their unbalanced terminations provide the input and output of the filter. In other alternative arrangements (not shown), one or both of the WCRs 10 and 12 can have both terminations either unbalanced or balanced, to provide any desired combination of unbalanced and/or balanced input and output connections for the filter.

Figure 3:
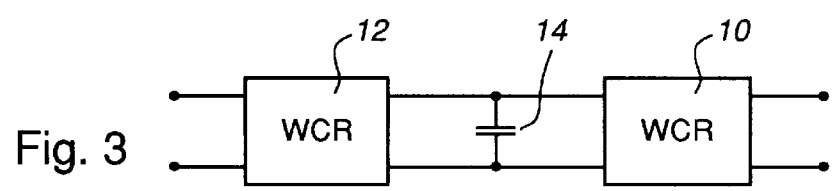

In another alternative arrangement as shown in FIG. 3, in which the WCRs 10 and 12 have balanced terminations interconnected to connect the WCRs in cascade, the additional shunt capacitance 14 is connected between the two balanced connections between the WCRs, where it is also in parallel with the static capacitances of the WCRs. FIG. 3 also shows the WCRs 10 and 12 as both having balanced input and output terminations, so that the 4-pole filter has balanced input and output connections, and as illustrated no ground connections are required. The filter input and/or output can if desired be used in an unbalanced mode with an unbalanced connection to one side and a ground connection to the other side of the balanced termination. A combination of the arrangements of FIGS. 2 and 3 can also be provided.

Each of the WCRs 10 and 12 can have any desired form, for example as described in detail in the Saw et al. patent referred to above. Accordingly, particular details of the WCRs 10 and 12 need not be, and are not, fully described here. The entire filter, comprising the WCRs 10 and 12 and each capacitance 14, are desirably incorporated into a single package, either all on the same substrate or die or with the two WCRs on two separate substrates or dies. The arrangements and alternatives that are described here can be similarly applied to higher order filters comprising three or more WCRs or other resonators or surface wave device filters connected together in cascade.

Figure 4:
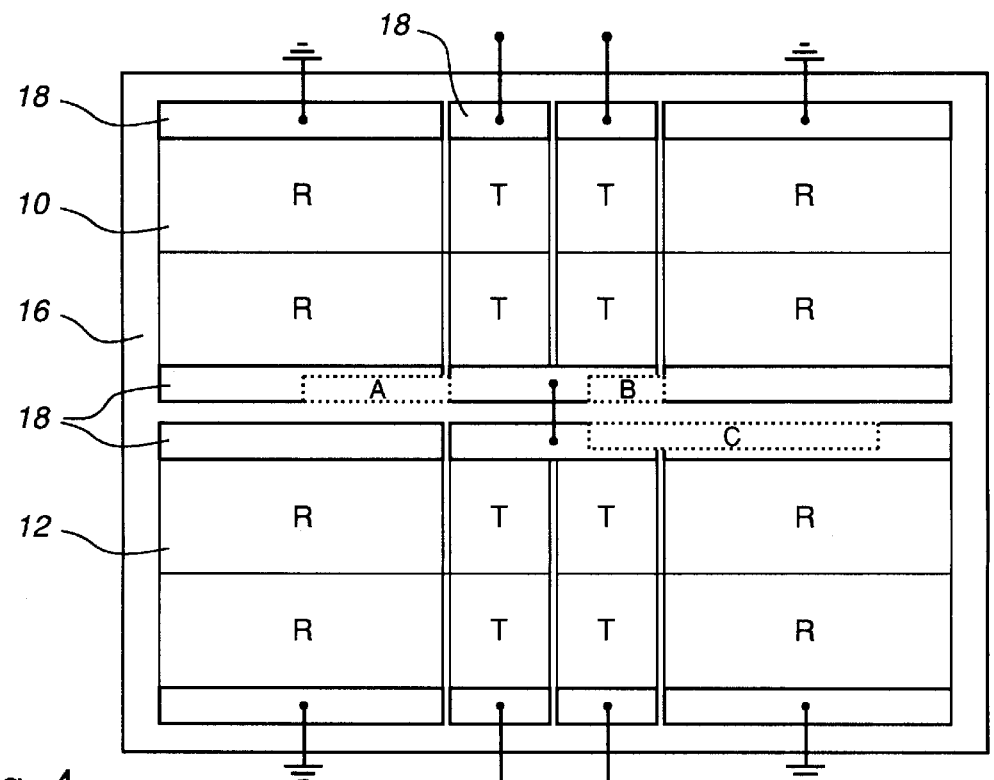
FIG. 4 schematically illustrates a physical arrangement of the cascaded WCRs and additional capacitance of FIG. 1.

FIG. 4 illustrates a physical arrangement of the cascaded WCRs 10 and 12 of the circuit of FIG. 1 side by side on a single piezoelectric substrate 16. Each WCR 10 or 12 comprises two pairs of interdigital transducer (IDT) halves T between two pairs of reflection gratings R which in this case are grounded as shown. A balanced connection is made to each of the WCRs 10 and 12 to provide the input and output of the 4-pole filter, and an unbalanced connection is made between the WCRs 10 and 12 to connect them in cascade, consistent with the electrical circuit of FIG. 1. These connections are made to outer connection rails or bonding pads 18 of the WCRs 10 and 12 in known manner. Again, reference is directed to the Saw et al. patent referred to above for a detailed description of forms of the WCRs 10 and 12; for example these can correspond to the form shown in FIG. 9 of that patent.

Although the additional capacitance 14 shown in FIG. 1 could be provided externally of the WCR package, this is undesirable because it would entail providing a separate component and an additional connection to the package, and the capacitance would be relatively uncontrolled in value. The latter is particularly significant in view of the relatively small capacitance value, for example of the order of 1 pF, which in practice may be required of the capacitance 14.

In order to avoid these disadvantages, and to avoid any need for a separate component within the package or for additional processing steps in making the filter with the additional capacitance 14, this additional capacitance is constituted by conductors formed on the substrate 16 in the same manner as and at the same time as the conductors of the reflection gratings R, transducer halves T, and conductive rails 18. The conductors forming the additional capacitance 14 are arranged as fingers of an interdigital structure (IDS). Because the fingers of the IDS can have a transducer effect tending to generate surface waves, they are arranged so that any such surface waves generated have a substantially different propagation direction, preferably perpendicular to, the direction (the left-right direction in FIG. 4) of propagation of the WCR surface waves. In addition, the conductors of the additional capacitance 14 can be arranged as described below to minimize the generation of undesired surface waves.

Furthermore, in order to dispense with any need to increase the size of the substrate 16 to accommodate the additional capacitance 14, in the arrangement of FIG. 4 this capacitance is provided within regions which would otherwise be occupied by one or more of the connection rails 18. More particularly, regions of one or more of the outer rails 18 of either or both of the WCRs 10 and 12, adjacent to the respective other WCR and the cascade connection between the WCRs, are modified by reducing their widths to provide space for forming the additional capacitance 14 and its connections. In FIG. 4, examples of such regions are outlined by dotted lines and are identified A, B, and C.

The region A would normally be occupied by part of a rail 18 of the WCR 10 which is electrically connected to fingers of a grounded reflection grating R and hence is also at ground potential, adjacent to a rail electrically connected to IDT halves T of the WCR 10 and providing the unbalanced connection to this WCR. The region B would normally be occupied by part of this same rail of the WCR 10 providing its unbalanced connection, adjacent to another grounded rail connected to a reflection grating R. The region C is effectively a combination of regions such as A and B, applied to rails of the WCR 12.

It can be appreciated that capacitances in these regions A, B, and C would all be electrically in parallel with one another, because a capacitance in each such region is connected between the unbalanced cascade connection between the two WCRs 10 and 12 and ground. Consequently any one or more of such regions, in a symmetrical or asymmetrical arrangement, can be used to provide the desired additional capacitance 14.

For a balanced cascade connection between the two WCRs 10 and 12 as illustrated in FIG. 2, there are correspondingly two separate connections between the IDT halves of the WCRs 10 and 12. In this case regions such as A, B, and C in FIG. 4 can similarly be used, conveniently in a symmetrical arrangement to provide two equal capacitances 14 to ground, one for each of the two balanced signal connections, to provide the two capacitances in substantially the same manner.

Although the above description and FIG. 4 assume that the WCRs 10 and 12 are both on the same substrate 16, this need not be the case and similar arrangements of the additional capacitance(s) 14 can be provided if the WCRs 10 and 12 are on different substrates within the same package.

FIG. 5 illustrates an enlarged view of part of the WCR 10 including the region A shown in FIG. 4.

Referring to FIG. 5, a reflection grating R, referenced 20 and only part of the length of which is illustrated, of the WCR 10 has fingers extending between a connection rail 22, constituting one of the rails 18 in FIG. 4, and a central or inner rail 26 of the WCR 10. Part of the second reflection grating R, referenced 24, also connected to the inner rail 26 is also shown in FIG. 5. As described above with reference to FIG. 4, the reflection gratings 20 and 24 and the outer and inner rails 22 and 26 are grounded. FIG. 5 also illustrates parts of the IDT halves T adjacent to the reflection gratings 20 and 24. As is described in the Saw et al. patent referred to above, each transducer half T comprises interdigital fingers that extend alternately from the inner rail 26 and another connection rails 18 of the WCR 10, part of which is illustrated in FIG. 5 and referenced 30. The rail 30 in FIG. 5 corresponds to the unbalanced signal connection of the WCR 10 in FIGS. 1 and 4 (it could equally correspond to one of the two balanced connections of the WCR 10 in FIG. 2).

The additional capacitance 14, or one of a plurality of electrically parallel components of this additional capacitance, is provided in FIG. 5 by interdigital fingers extending, in the reduced-width region A which would otherwise be occupied by parts of the rail 22, alternately from the rails 22 and 30. In FIG. 5 these fingers extending from the rail 22 are referenced 32, and these fingers extending from the rail 30 are referenced 34.

The fingers 32 and 34 extend in the direction of the length of the rail 22, and hence perpendicularly to the fingers of the reflection gratings R and IDT halves T. These fingers 32 and 34 constitute an IDS which is likewise perpendicular to the IDT halves T, so that any surface waves that they generate are perpendicular to desired surface waves of the WCRs 10 and 12, so that there is substantially no interference with the desired surface waves and the normal operation of the WCRs is not adversely affected by any transducer effects of the fingers 32 and 34. At the same time, the fingers 32 and 34 have a capacitance between them which constitutes part or all of the additional capacitance 14.

The number, spacing, and lengths of the fingers 32 and 34 can be varied to suit particular circumstances and to provide a desired magnitude of the additional capacitance 14. As indicated above, this additional capacitance can be quite small so that it is relatively easily provided by the fingers 32 and 34. In the illustration of FIG. 5, the fingers 32 and 34 are shown as having substantially the same periodicity as the fingers of the transducer halves T; this is convenient for the photolithographic processes used for producing the entire WCR or filter, but need not necessarily be the case. In particular, other peiriodicities or arrangements of the interdigital fingers of the IDS may be provided as may be desired, for example to reduce the magnitude of any surface wave generated by these fingers.

In this respect, FIG. 6 illustrates by way of example an alternative arrangement of the fingers 32 and 34 in the region A, in which a phase change is introduced, in the center of the IDS produced by these fingers 32 and 34, by providing two of the fingers 34 extending from the rail 30 adjacent to one another. Consequently, any surface waves generated by the two halves of the IDS constituted by the fingers 32 and 34 are substantially equal and oppositely phased so that they cancel one another.

Figure 7:
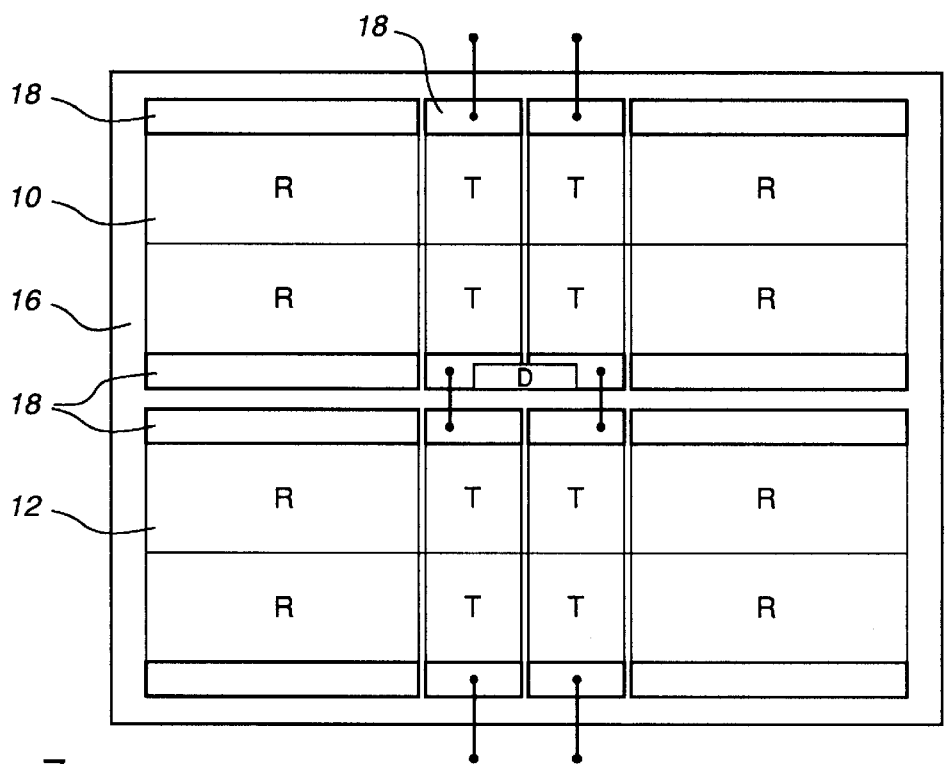
FIG. 7 schematically illustrates a physical arrangement of the cascaded WCRs and additional capacitance of FIG. 3.

FIG. 7 illustrates, in a similar manner to the illustration of FIG. 4, a physical arrangement of the cascaded WCRs 10 and 12 of the circuit of FIG. 3. As shown in FIG. 7, in this case each WCR 10 or 12 provides differential or balanced connections to its oppositely phased transducer halves T, and the reflection gratings R can be grounded or can be electrically floating as shown. The balanced connections between the WCRs 10 and 12 to connect them in cascade have the additional capacitance 14, connected between them, provided by an IDS at a reduced width region D of the differential connection rails of this balanced cascade connection.

Figure 8:
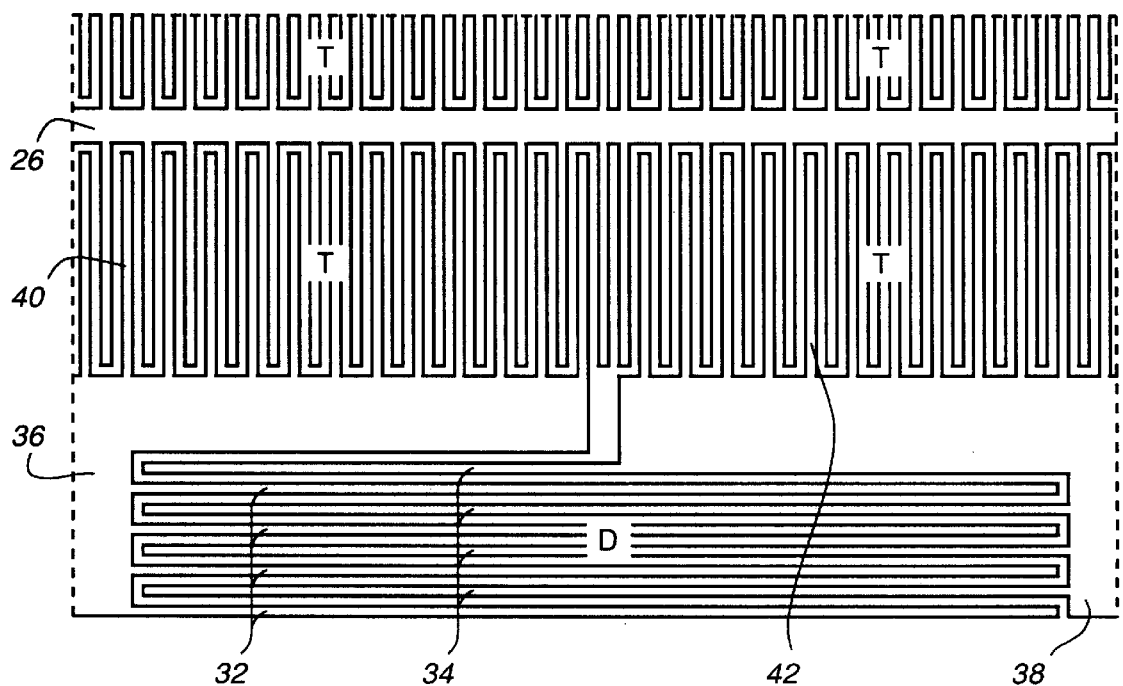
FIG. 8 schematically illustrates in enlarged view an arrangement of the additional capacitance of FIGS. 3 and 7.

As shown in the enlarged view of FIG. 8, in a similar manner to the illustration in FIG. 5, the additional capacitance 14 is again provided in the region D by fingers 32 and 34 of an IDS, the fingers 32 extending from an outer rail 36 in a reduced width portion thereof and the fingers 34 extending from an outer rail 38 in a reduced width region of this rail. Fingers 40 of the transducer half T connected to the rail 36 are oppositely phased to fingers 42 of the transducer half T connected to the rail 38, so that the rails 36 and 38 provide a differential or balanced connection as described in the Saw et al. patent referred to above. As described above with reference to FIGS. 4 to 6, the fingers 32 and 34 in the IDS of FIGS. 7 and 8 can be oppositely phased or otherwise arranged to reduce generation of surface waves.

It can be appreciated that, beyond initial design, the provision of the additional capacitance(s) 14 in the manners described above with reference to FIGS. 4 to 8 need not add any steps or requirements to those already required for the manufacture of the filter. The additional capacitance(s) can be provided with precise and repeatable characteristics, so that they can be designed to modify the characteristics of the filter in a precise and consistent manner to achieve the desired decreased capacitance ratio, enabling the filter bandwidth to be narrowed while still providing good matching for a relatively ripple-free filter passband. Because a small additional capacitance value will generally be sufficient for this purpose, no extra space is required on the piezoelectric substrate. However, it can be appreciated that alternatively, especially where a larger capacitance may be required, the additional capacitance can be provided on a larger substrate in an area of the substrate that is not otherwise used, again with the IDS formed by the fingers providing the additional capacitance at a substantial angle, conveniently perpendicular, to the IDTs of the surface wave devices on the substrate. For example, in arrangements of two WCRs connected in cascade as described above, an additional capacitance can be provided in this manner in a space on the substrate between the two WCRs.

It can also be appreciated that, although in the above described embodiments of the invention the interdigital fingers 32 and 34 forming the capacitance 14 are perpendicular to the fingers of the WCRs 10 and 12, this need not be the case. Instead, the fingers 32 and 34 of the IDS forming the additional capacitance could be at an arbitrary angle relative to the fingers of the WCRs, provided that any surface waves propagated from this IDT are at a sufficiently different angle (referred to herein as a substantially different angle) that interference with the surface waves of the WCRs 10 and 12 (or of each WCR on the same substrate where the WCRs are on different substrates) is avoided.

Although the above arrangements relate specifically to additional shunt capacitance in the cascade connection of two WCRs to form a 4-pole filter, it can be appreciated that the same principles can be applied in any other situation where it may be advantageous to provide an additional capacitance to which a surface wave device is to be connected. Thus, for example, other forms of surface wave resonator or filter, and surface wave devices other than filters and resonators, may be provided with additional capacitance in a similar manner.

Thus although particular embodiments of the invention have been described in detail, it should be appreciated that numerous modifications, variations, and adaptations may be made without departing from the scope of the invention as defined in the claims.

What is claimed is:

1. A surface wave device comprising at least two waveguide coupled double mode surface wave resonators (WCRs) electrically connected together in cascade, the WCRs being provided in a single package on a surface of at least one piezoelectric substrate, and at least one shunt capacitance connected in parallel with a static capacitance of at least one of the WCRs, the shunt capacitance being constituted by fingers forming an interdigital structure (IDS) on said surface and arranged to avoid interference with surface waves propagated by the WCRs, wherein the fingers forming the IDS are arranged to substantially suppress generation of surface waves by the IDS.

2. A surface wave device as claimed in claim 1 wherein the fingers forming the IDS are substantially perpendicular to fingers of each WCR on the same substrate.

3. A surface wave device comprising:

a piezoelectric substrate;

at least one interdigital transducer (IDT) on a surface of the substrate for transducing surface waves in a first direction on the substrate; and a capacitance comprising fingers forming at least one interdigital structure (IDS) on the surface of the substrate arranged so that any surface waves propagated on the surface of the substrate by the IDS have a second direction of propagation that is substantially different from the first direction, wherein the IDS is connected between connection rails of a surface wave component comprising the IDT and is positioned in a reduced-width portion of at least one of the connection rails.

4. A surface wave device as claimed in claim 3 wherein the fingers of the IDS are substantially perpendicular to fingers of the IDT, whereby the second direction is substantially perpendicular to the first direction.

5. A surface wave device as claimed in claim 3 wherein the surface wave component comprising the IDT comprises a double mode surface wave resonator.

6. A surface wave device as claimed in claim 3 wherein the surface wave component comprising the IDT comprises two waveguide coupled resonators (WCRs) electrically connected together in cascade via at least one signal connection which includes a connection rail to which the IDS is connected.

7. A surface wave device as claimed in claim 6 wherein the two WCRs are connected together in cascade via two balanced signal connections including respective connection rails, and there are two IDSs each arranged to provide a capacitance to ground from a respective one of the two balanced signal connections.

8. A surface wave device as claimed in claim 6 wherein the two WCRs are connected together in cascade via two balanced signal connections including respective connection rails, and the IDS provides the capacitance between the two balanced signal connections.

9. A surface wave device comprising:

a piezoelectric substrate;

at least one interdigital transducer (IDT) on a surface of the substrate for transducing surface waves in a first direction on the substrate; and a capacitance comprising fingers forming at least one interdigital structure (IDS) on the surface of the substrate arranged so that any surface waves propagated on the surface of the substrate by the IDS have a second direction of propagation that is substantially different from the first direction, wherein the IDS includes oppositely phased interdigital fingers arranged to substantially suppress generation of surface waves by the IDS.

10. A surface wave device comprising two waveguide coupled double mode resonators (WCRs) electrically connected together in cascade, and a shunt capacitance connected in parallel with static capacitances of the WCRs, wherein the shunt capacitance is constituted by fingers forming an interdigital structure (IDS) on a surface of a piezoelectric substrate on which at least one of the WCRs is provided, and the interdigital fingers of the IDS include oppositely phased fingers arranged to substantially suppress generation of surface waves by the IDS.

11. A surface wave device as claimed in claim 10 wherein the two WCRs are electrically connected in cascade via an unbalanced signal connection, and the shunt capacitance is connected between the unbalanced signal connection and a ground connection.

12. A surface wave device comprising two waveguide coupled double mode resonators (WCRs) electrically connected together in cascade via two balanced signal connections, and two shunt capacitances connected in parallel with static capacitances of the WCRs, each shunt capacitance being connected between a respective one of the two balanced signal connections and a ground connection.

13. A surface wave device as claimed in claim 12 wherein each shunt capacitance is constituted by fingers forming an interdigital structure (IDS) on a surface of a piezoelectric substrate on which at least one of the WCRs is provided.

14. A surface wave device as claimed in claim 13 wherein the WCRs and each IDS are all provided on a surface of the same piezoelectric substrate.

15. A surface wave device as claimed in claim 13 wherein each IDS is arranged so that any surface waves propagated by the IDS have a substantially different direction of propagation from that of surface waves of each WCR on the same substrate.

16. A surface wave device as claimed in claim 13 wherein interdigital fingers of each IDS are substantially perpendicular to fingers of each WCR on the same substrate.

17. A surface wave device as claimed in claim 16 wherein interdigital fingers of each IDS are positioned in a reduced-width portion of at least one conductive rail of at least one of the WCRs.

18. A surface wave device as claimed in claim 13 wherein the interdigital fingers of each IDS include oppositely phased fingers.

19. A surface wave device comprising two waveguide coupled double mode resonators (WCRs) electrically connected together in cascade via two balanced signal connections, and a shunt capacitance connected in parallel with static capacitances of the WCRs, the shunt capacitance being connected between the two balanced signal connections.

20. A surface wave device as claimed in claim 19 wherein the shunt capacitance is constituted by fingers forming an interdigital structure (IDS) on a surface of a piezoelectric substrate on which at least one of the WCRs is provided.

21. A surface wave device as claimed in claim 20 wherein the IDS is arranged so that any surface waves propagated by the IDS have a substantially different direction of propagation from that of surface waves of each WCR on the same substrate.

22. A surface wave device as claimed in claim 20 wherein interdigital fingers of the IDS are substantially perpendicular to fingers of each WCR on the same substrate.

23. A surface wave device as claimed in claim 23 wherein interdigital fingers of the IDS are positioned in a reduced-width portion of at least one conductive rail of at least one of the WCRs.

24. A surface wave device as claimed in claim 20 wherein the interdigital fingers of the IDS include oppositely phased fingers.

25. A surface wave device as claimed in claim 20 wherein the WCRs and the IDS are all provided on a surface of the same piezoelectric substrate.

* * * * *